US010111357B2

United States Patent
Chen

(10) Patent No.: US 10,111,357 B2
(45) Date of Patent: Oct. 23, 2018

(54) DETACHABLE INNER SLIDING RAIL MOUNTING STRUCTURE FOR SERVER SLIDING RAIL ASSEMBLY

(71) Applicant: GSLIDE CORPORATION, New Taipei (TW)

(72) Inventor: Yung-Liang Chen, Taipei Shien (TW)

(73) Assignee: GSLIDE CORPORATION, New Taipei (TW)

( * ) Notice: Subject to any disclaimer, the term of this patent is extended or adjusted under 35 U.S.C. 154(b) by 50 days.

(21) Appl. No.: 15/463,029

(22) Filed: Mar. 20, 2017

(65) Prior Publication Data

US 2018/0270982 A1   Sep. 20, 2018

(51) Int. Cl.
| | |
|---|---|
| A47B 88/00 | (2017.01) |
| A47B 88/04 | (2006.01) |
| H05K 7/14 | (2006.01) |
| A47B 88/483 | (2017.01) |
| A47B 88/49 | (2017.01) |
| A47B 88/477 | (2017.01) |
| A47B 88/427 | (2017.01) |
| F16C 29/00 | (2006.01) |
| A47B 88/493 | (2017.01) |
| A47B 88/57 | (2017.01) |

(52) U.S. Cl.
CPC ......... *H05K 7/1489* (2013.01); *A47B 88/427* (2017.01); *A47B 88/477* (2017.01); *A47B 88/483* (2017.01); *A47B 88/49* (2017.01); *A47B 88/493* (2017.01); *A47B 88/57* (2017.01); *F16C 29/004* (2013.01)

(58) Field of Classification Search
CPC ....... A47B 88/43; A47B 88/49; A47B 88/493; A47B 88/483; A47B 88/427; A47B 88/57; H05K 7/1489
USPC ................. 312/333, 334.46, 334.44, 334.47
See application file for complete search history.

(56) References Cited

U.S. PATENT DOCUMENTS

| 6,412,891 B1 * | 7/2002 | Liang | A47B 88/487 |
| | | | 312/333 |
| 6,935,710 B2 * | 8/2005 | Chen | A47B 88/487 |
| | | | 312/333 |
| 6,945,619 B1 * | 9/2005 | Chen | A47B 88/487 |
| | | | 312/334.44 |

(Continued)

FOREIGN PATENT DOCUMENTS

TW         201428911 A        7/2014

*Primary Examiner* — Kimberley S Wright
(74) *Attorney, Agent, or Firm* — Cook Alex Ltd.

(57) ABSTRACT

A detachable inner sliding rail mounting structure for use in a server sliding rail assembly includes a pull bar, a plastic pull tab, a guide block, an engagement plate and a spring. The inner sliding rail is mounted in another sliding rail that has a stop block. When mounting the inner sliding rail the another sliding rail, the user simply needs to directly insert the inner sliding rail into the another sliding rail, and the engagement plate can be directly biased by a stop block on the another sliding rail to force the retaining notch of the engagement plate into engagement with the stop block. When dismounting the inner sliding rail, the user can selectively operate the plastic pull tab to move the engagement plate, or directly move the engagement plate to disengage the engagement plate from the inner sliding rail, avoiding danger and ensuring a high level of safety.

6 Claims, 15 Drawing Sheets

(56) References Cited

U.S. PATENT DOCUMENTS

| | | | | |
|---|---|---|---|---|
| 7,465,000 B2* | 12/2008 | Huang | ............... | A47B 88/467 |
| | | | | 312/333 |
| 7,571,968 B2* | 8/2009 | Ji | ................. | A47B 88/493 |
| | | | | 312/333 |
| 7,658,457 B2* | 2/2010 | Lu | ..................... | A47B 88/57 |
| | | | | 312/333 |
| 7,708,359 B2* | 5/2010 | Peng | .................. | A47B 88/57 |
| | | | | 312/334.44 |
| 7,726,755 B2* | 6/2010 | Peng | .................. | A47B 88/57 |
| | | | | 312/334.46 |
| 7,744,175 B2* | 6/2010 | Peng | .................. | A47B 88/57 |
| | | | | 312/333 |
| 7,758,134 B2* | 7/2010 | Huang | ................. | A47B 88/49 |
| | | | | 312/334.47 |
| 8,007,060 B2* | 8/2011 | Duan | ................. | H05K 7/1489 |
| | | | | 312/333 |
| 8,303,052 B2* | 11/2012 | Chen | ................. | A47B 88/493 |
| | | | | 312/319.1 |
| 9,675,175 B1* | 6/2017 | Chen | ................. | A47B 88/12 |
| 9,848,701 B1* | 12/2017 | Chen | ................. | A47B 88/49 |
| 9,980,565 B2* | 5/2018 | Chen | ................. | F16C 29/123 |
| 9,980,566 B2* | 5/2018 | Chen | ................. | A47B 88/44 |
| 2004/0174104 A1* | 9/2004 | Chen | ................. | A47B 88/467 |
| | | | | 312/334.47 |
| 2006/0078235 A1* | 4/2006 | Chen | ................. | A47B 88/493 |
| | | | | 384/18 |
| 2008/0111457 A1* | 5/2008 | Ji | ..................... | A47B 88/493 |
| | | | | 312/334.44 |
| 2010/0019638 A1* | 1/2010 | Duan | ................. | G06F 1/183 |
| | | | | 312/334.44 |

* cited by examiner

DETACHABLE INNER SLIDING RAIL MOUNTING STRUCTURE FOR SERVER SLIDING RAIL ASSEMBLY

BACKGROUND OF THE INVENTION

Field of the Invention

The present invention relates to server sliding rail technology and more particularly, to a detachable inner sliding rail mounting structure for use in a server sliding rail assembly, which can be directly and conveniently mounted in an inner sliding rail of a server sliding rail assembly without using both hands, or dismounted from the inner sliding rail by selectively operating a plastic pull tab to move an engagement plate, or directly moving the engagement plate to disengage the engagement plate from the inner sliding rail.

Description of the Related Art

With common prior art apparatus, when dismounting an inner sliding rail of a server sliding rail assembly from an intermediate sliding rail along with a server that is connected to the inner sliding rail, the user needs to pull a pull bar rearward to disengage an engagement plate from a stop block at the intermediate sliding rail. However, if the server is heavy and has a long length (more particularly in a server sliding rail assembly of three-section design), the user needs to hold the heavy server and pull the pull bar using two hands, and an accident can occur during the dismounting operation. Further, when mounting the inner sliding rail in the intermediate sliding rail after connecting the inner sliding rail to the server, the user still needs to pull the pull bar with two hands. This mounting operation is not convenient and can be dangerous if the server is heavy.

SUMMARY OF THE INVENTION

The present invention overcomes disadvantages of the prior art. It is therefore a main object of the present invention to provide a detachable inner sliding rail mounting structure for use in a server sliding rail assembly, which can be directly and conveniently mounted in the inner sliding rail of the server sliding rail assembly without a user using both hands.

It is therefore a main object of the present invention to provide a detachable inner sliding rail mounting structure for use in a server sliding rail assembly, which can be dismounted by selectively operating a plastic pull tab to move the engagement plate, or directly moving the engagement plate to disengage the engagement plate from the inner sliding rail, avoiding danger and ensuring a high level of safety.

It will be appreciated that the present invention may utilized in sliding rail assemblies for mounting a server in a server cabinet wherein the sliding rail assembly has at least an inner sliding rail and another sliding rail, with the another sliding rail including a stop block. Thus, the sliding rail assembly may include a detachable inner sliding rail mounting structure for a server sliding rail assembly that comprises an inner sliding rail that is configured to be connected to an inner sidewall of a server, an outer sliding rail that is configured to be connected to an inner sidewall of a server cabinet, and an intermediate sliding rail slidably coupled between the inner sliding rail and the outer sliding rail 13, with the intermediate sliding rail being said another sliding rail and including said stop block. Alternatively, the sliding rail assembly may include only two sliding rails, such that the another sliding rail is an outer sliding rail that includes a stop block and is configured to be connected to an inner sidewall of a server cabinet.

DETAILED DESCRIPTION OF THE PREFERRED EMBODIMENT

Figure 1:
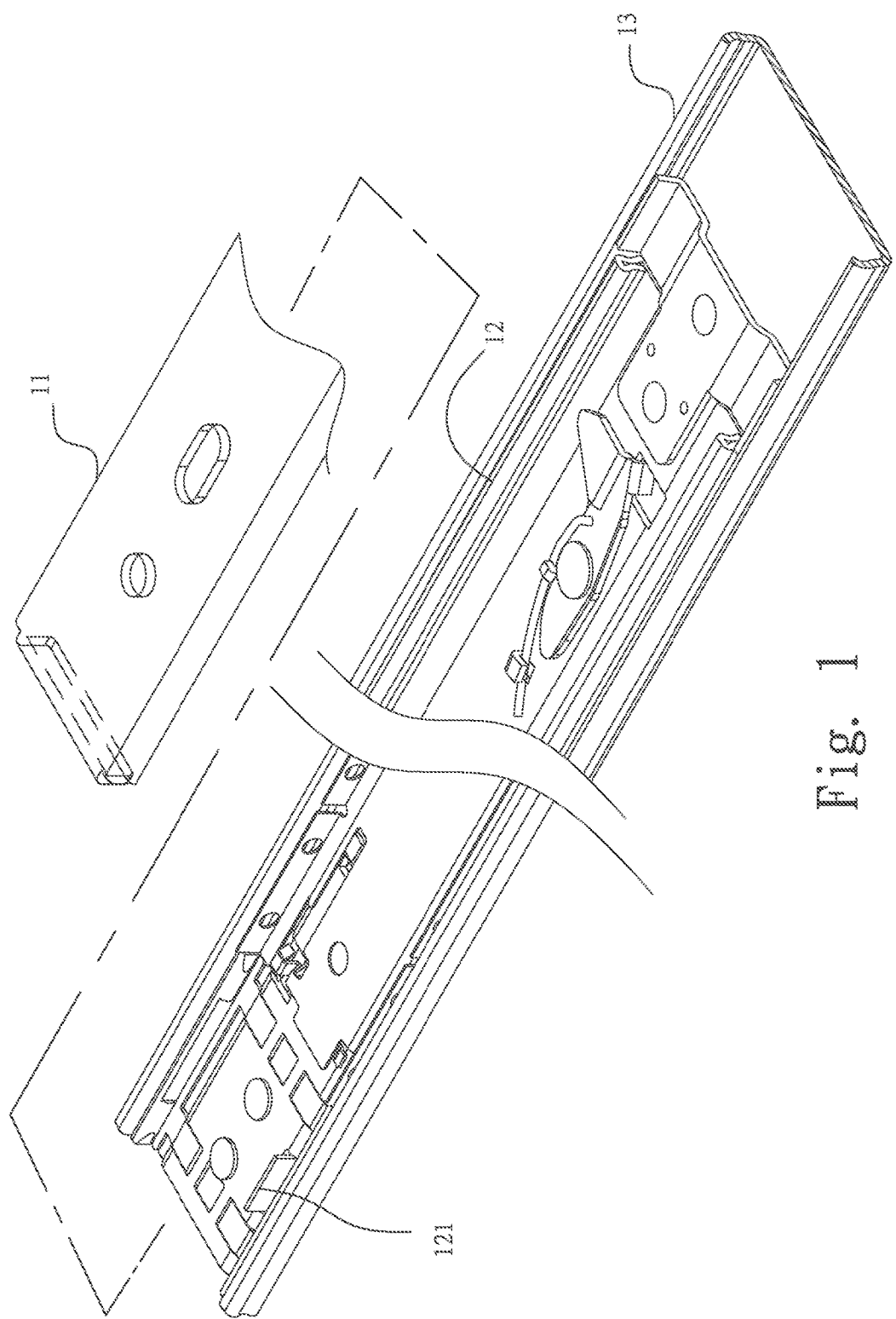
FIG. 1 is an enlarged schematic exploded perspective view of a server sliding rail assembly equipped with a detachable inner sliding rail mounting structure in accordance with the present invention.

Referring to FIGS. 1-15, a detachable inner sliding rail mounting structure for a server sliding rail assembly in accordance with the present invention is shown. The server sliding rail assembly comprises an inner sliding rail 11 that is configured to be connected to an inner sidewall of a server (not shown), an outer sliding rail 13 that is configured to be connected to an inner sidewall of a server cabinet (not shown), and an intermediate sliding rail 12 (see FIG. 1) slidably coupled between the inner sliding rail 11 and the outer sliding rail 13. Thus, when fully installed, the server can be moved with the inner sliding rail 11 in and out of the server cabinet.

The intermediate sliding rail 12 further comprises a stop block 121 (see FIGS. 1 and 4-14). In the present preferred embodiment, the sliding rail assembly consists of an inner sliding rail, an intermediate sliding rail and an outer sliding rail. If the server sliding rail assembly simply consists of an inner sliding rail and an outer sliding rail, the stop block should be located at the outer sliding rail.

Figure 2:
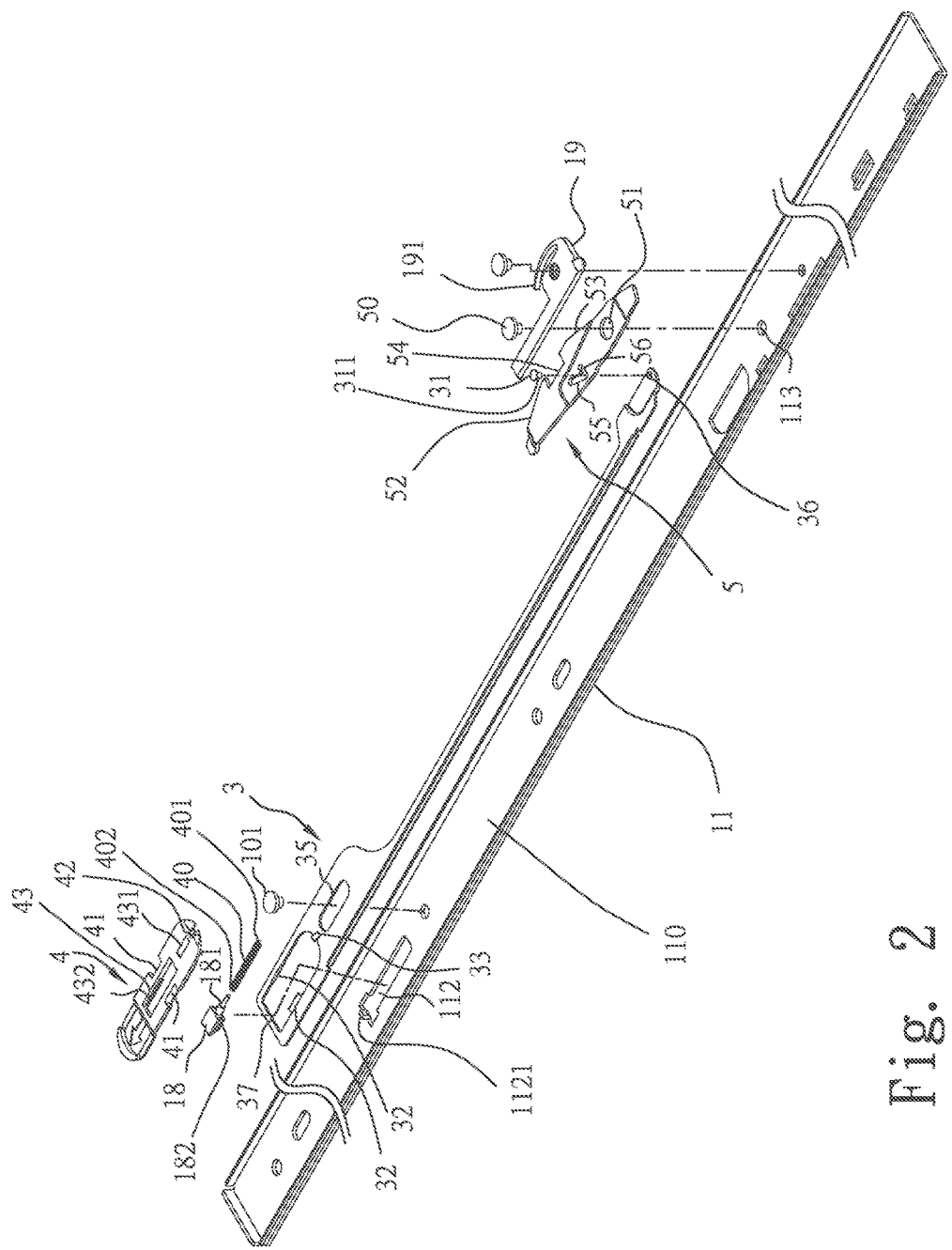
FIG. 2 is an exploded perspective view of the detachable inner sliding rail mounting structure in accordance with the present invention.
Figure 3:
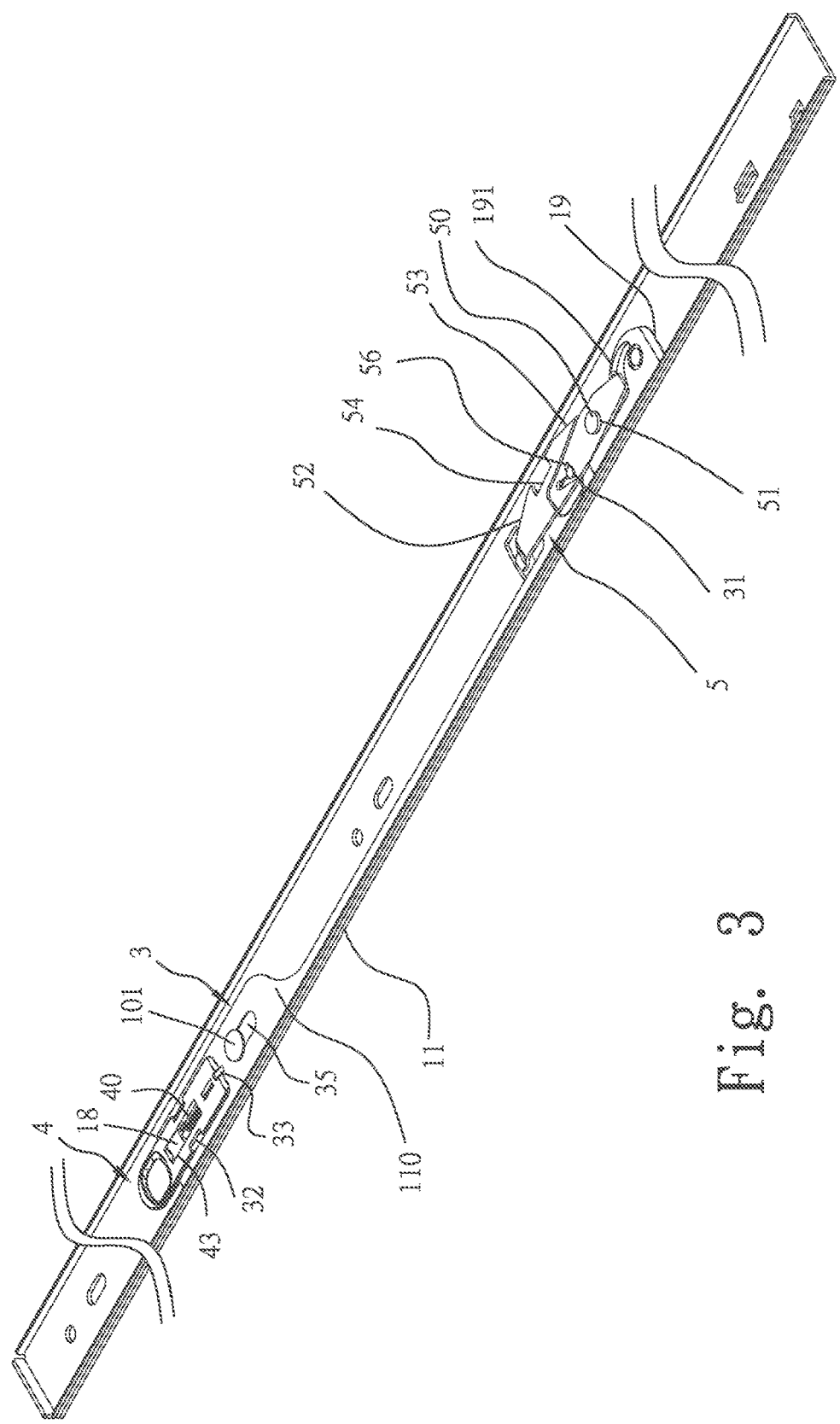
FIG. 3 is a perspective elevational view of the example of FIG. 2, illustrating the detachable inner sliding rail mounting structure installed in the inner sliding rail.
Figure 4:
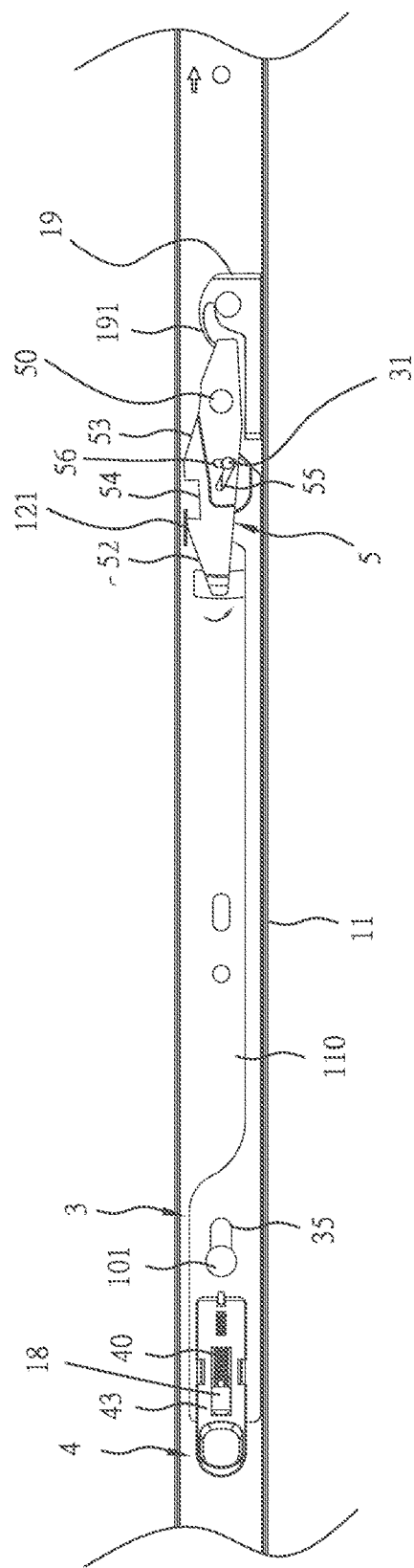
FIG. 4 is a schematic top plan view illustrating the inner sliding rail inserted into the intermediate sliding rail and the front guide edge of the engagement plate contacting the stop block of the intermediate sliding rail.
Figure 15:
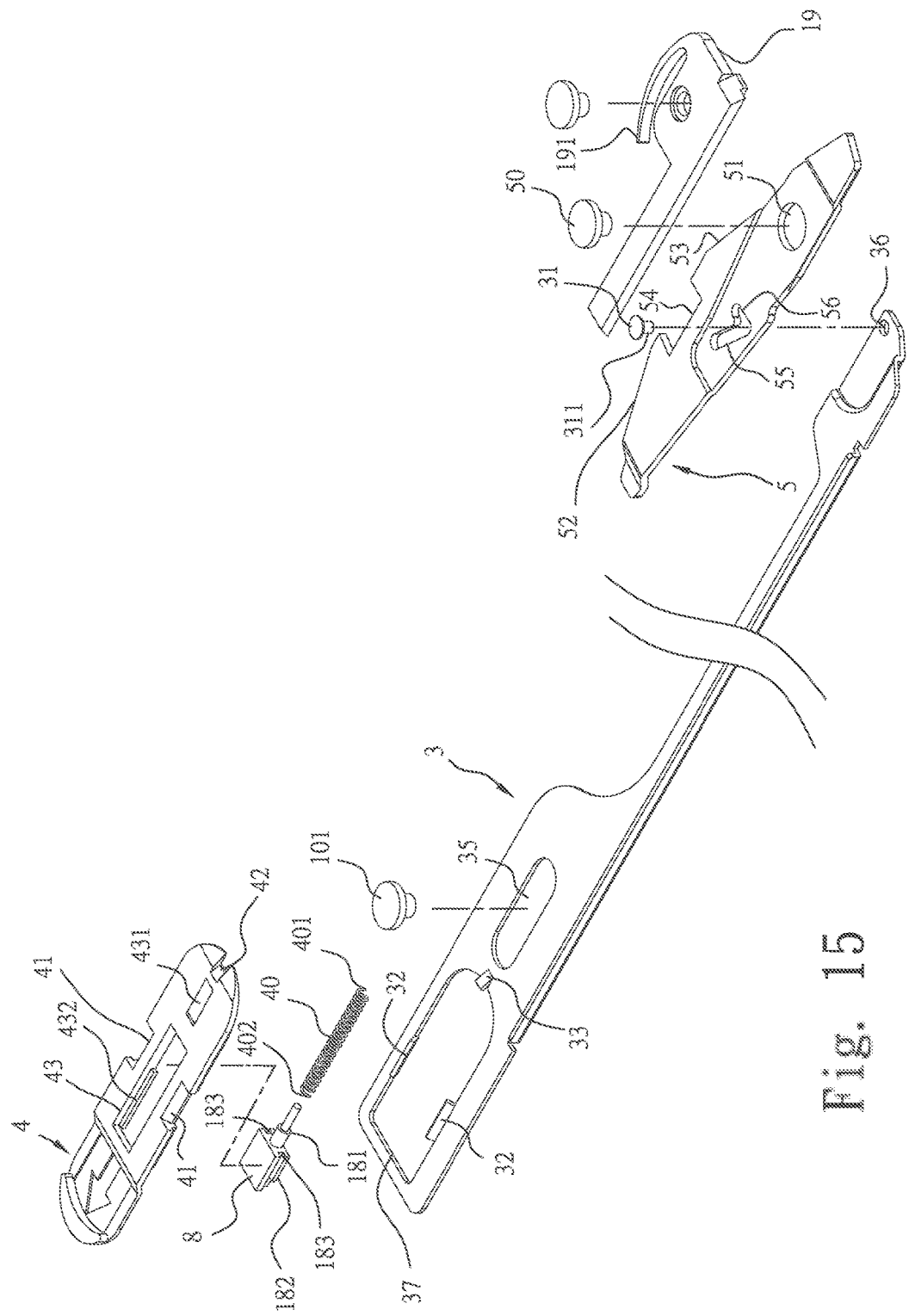
FIG. 15 is an enlarged schematic exploded view of the structures of the detachable inner sliding rail mounting structure for use in a server sliding rail assembly shown in FIG. 2, but without the inner sliding rail.

The detachable inner sliding rail mounting structure comprises a pull bar 3, a plastic pull tab 4, a guide block 18, and an engagement plate 5 (see FIGS. 2, 3 and 15).

Referring to FIGS. 2 and 15, the pull bar 3 is slidably mounted along an inner bottom surface 110 of the inner sliding rail 11, and includes a connection hole 36 located at a rear end thereof, a connection member 31 having a shank 311 inserted through the engagement plate 5 and connected to the connection hole 36 to pivotally connect the engagement plate 5 to the pull bar 3, an opening 37 located at an opposing front end thereof, an elongated slot 35 for receiving a positioning member 101 of the inner sliding rail 11 to limit the range of forward-rearward sliding movement of the pull bar 3 relative to the inner sliding rail 11, and a plurality of mounting lugs 32, 33 disposed around the opening 37 for connection of the plastic pull tab 4 to the pull bar 3. Alternatively, the plastic pull tab 4 can be directly riveted or otherwise connected to the front end of the pull bar 3.

Figure 5:
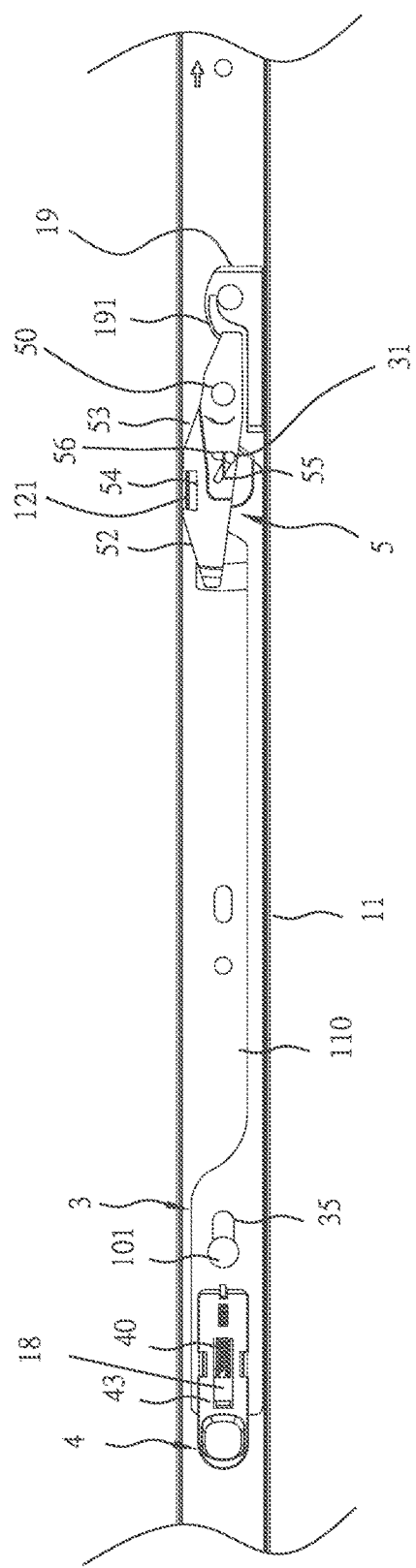
FIG. 5 is a schematic top plan view of the structures in FIGS. 2-4, illustrating the engagement plate biased such that it has moved to a position wherein the retaining notch of the engagement plate is forced into engagement with the stop block of the intermediate sliding rail.
Figure 6:
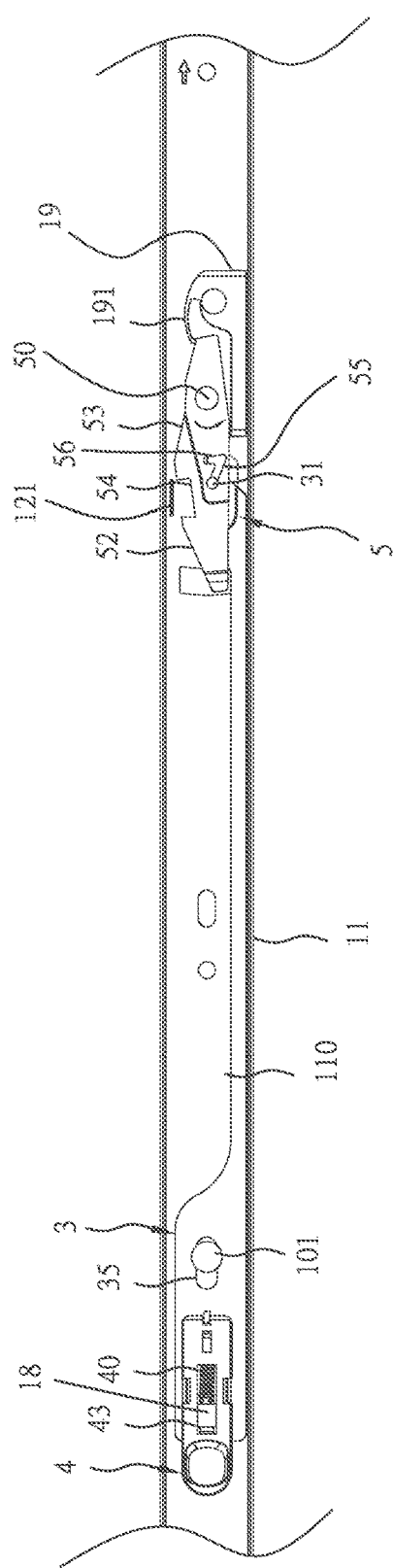
FIG. 6 is a schematic top plan view of the structures in FIGS. 2-5, illustrating when a plastic pull tab and a pull bar have been pulled forward and the retaining notch of the engagement plate is disengaged from the stop block of the intermediate sliding rail.
Figure 7:
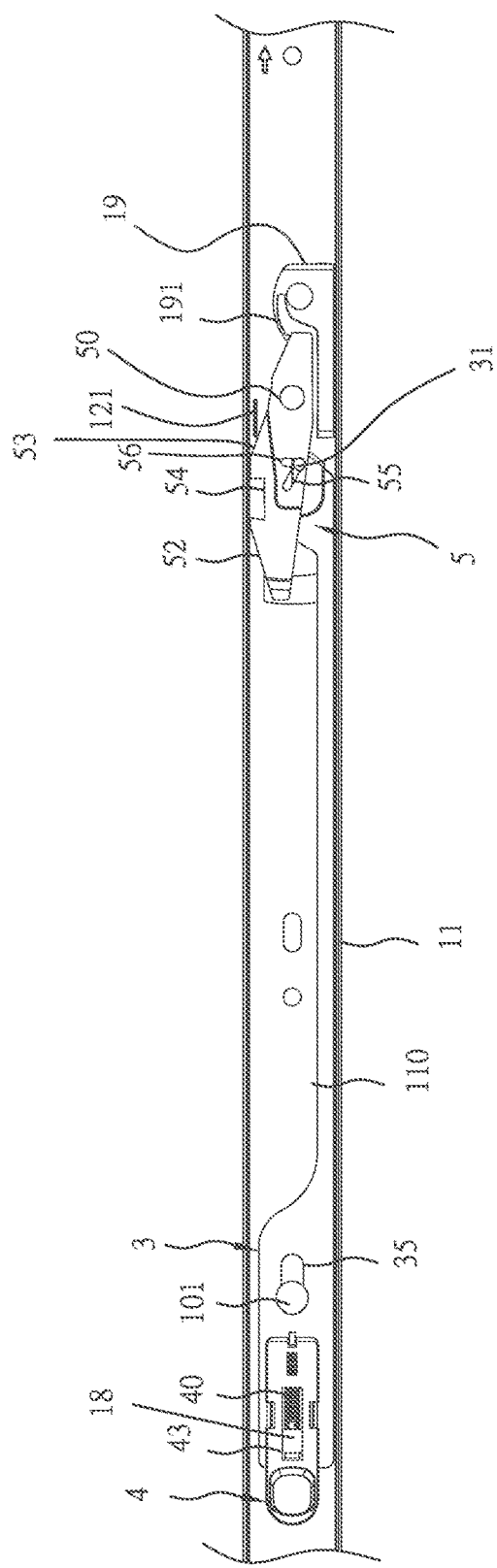
FIG. 7 is a schematic top plan view of the structures in FIGS. 2-6, illustrating the retaining notch of the engagement plate disengaged from the stop block of the intermediate sliding rail, the inner sliding rail is being moved rearward relative to the intermediate sliding rail and the rear guide edge of the engagement plate is forced into contact with the stop block of the intermediate sliding rail.
Figure 8:
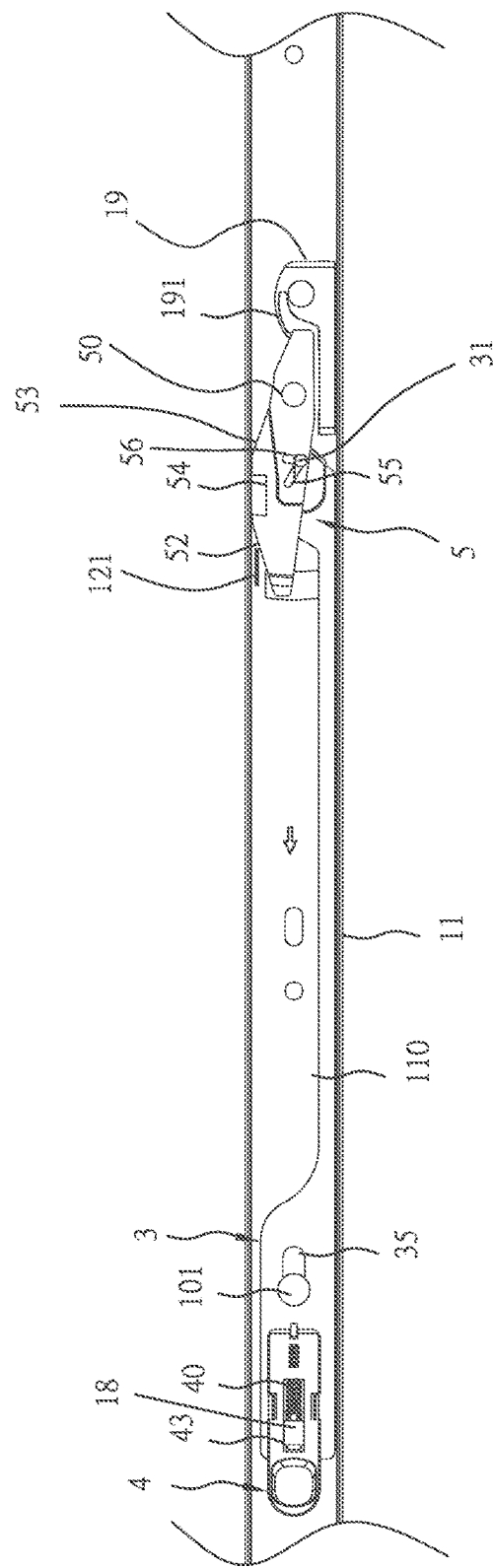
FIG. 8 is a schematic top plan view of the structures in FIGS. 2-7, illustrating when the plastic pull tab has not been pulled forward, the inner sliding rail is being moved forward and the front guide edge of the engagement plate is forced into contact with the stop block of the intermediate sliding rail.
Figure 9:
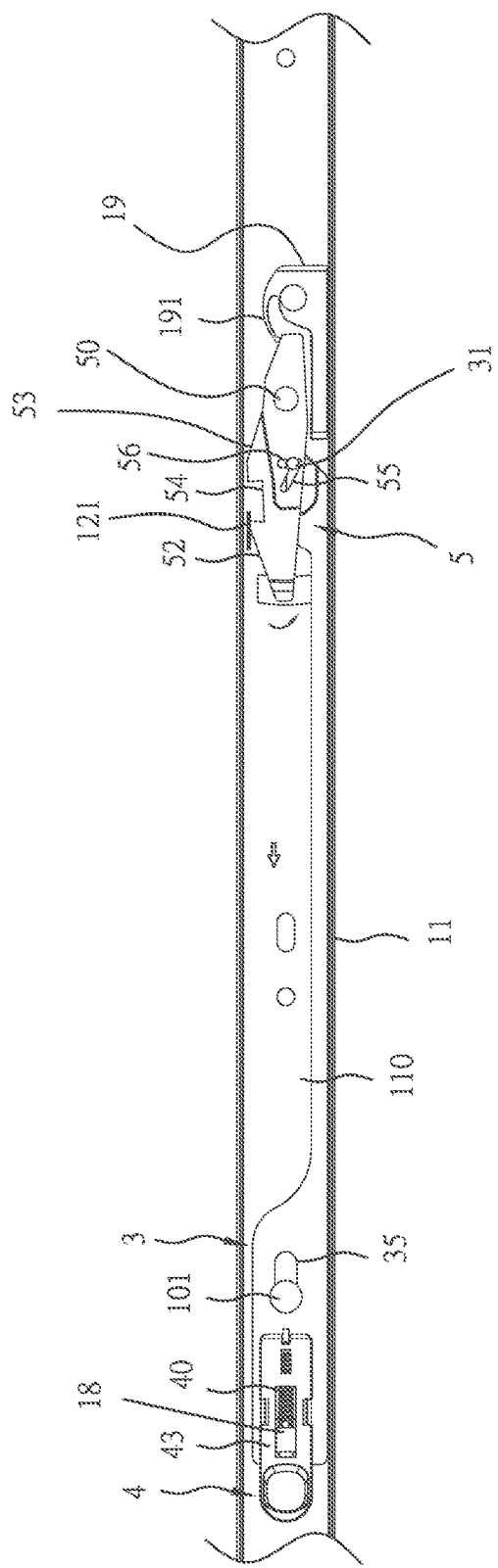
FIG. 9 is a schematic top plan view that corresponds to further forward movement of the inner sliding rail relative to the position in FIG. 8, illustrating the engagement plate being moved by the front guide edge contacting the stop block of the intermediate sliding rail.
Figure 10:
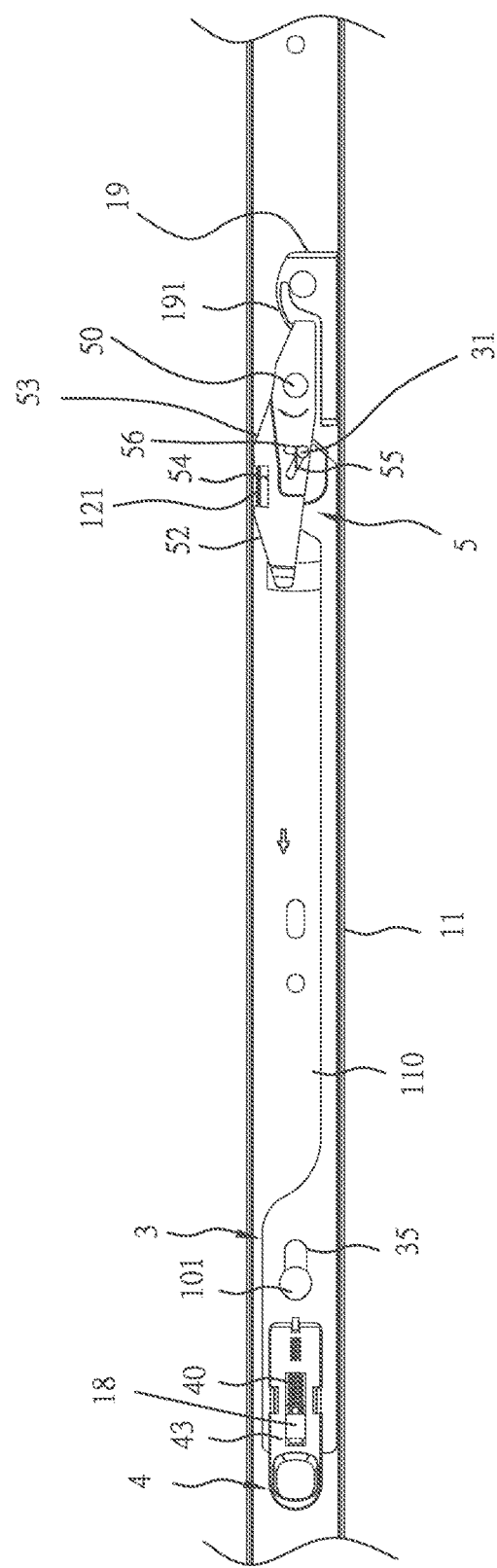
FIG. 10 is a schematic top plan view that corresponds to further forward movement of the inner sliding rail relative to the position in FIG. 9, illustrating the inner sliding rail moved forward and the engagement plate biased such that the retaining notch of the engagement plate is forced into engagement with the stop block of the intermediate sliding rail.

The plastic pull tab 4 seen in FIGS. 2 and 5 includes a plurality of mounting grooves 41, 42 (see also FIG. 15) respectively connected to the respective mounting lugs 32, 33 of the pull bar 3, a sliding groove 43, two rails 432 respectively extended along two opposite lateral sides of the sliding grooves 43 (see FIGS. 2 and 5) and coupled to the guide block 18 for enabling the plastic pull tab 4 to move forward and rearward relative to the guide block 18, a spring retaining portion 431 located at a rear side relative to the sliding groove 43, and a spring 40 having one end 401 thereof connected to the spring retaining portion 431 and an opposite end 402 thereof connected to the guide block 18, such that at rest said plastic pull tab 4 is in a rearward position. Thus, when the plastic pull tab 4 is being pulled forward, the spring 40 is compressed. Then, when the pulling force is removed, an elastic restoring energy of the spring 40 moves the plastic pull tab 4 to its rearward position.

The guide block 18 includes two guide grooves 183 (see FIG. 15) arranged at two opposite lateral sides thereof and respectively coupled to the rails 432 of the plastic pull tab 4, a mounting portion 182 located at a bottom side thereof (see also FIG. 15) and connected to a positioning groove 112 of the inner sliding rail 11 (see FIG. 2), and a spring retainer tip 181 located at a rear end thereof and connected to the opposite end 402 of the spring 40 (see FIGS. 2 and 15). Further, the opposing front end of the guide block 18 is stopped in place by a stop rod 1121 of the inner sliding rail 11 (see FIG. 2).

Figure 11:
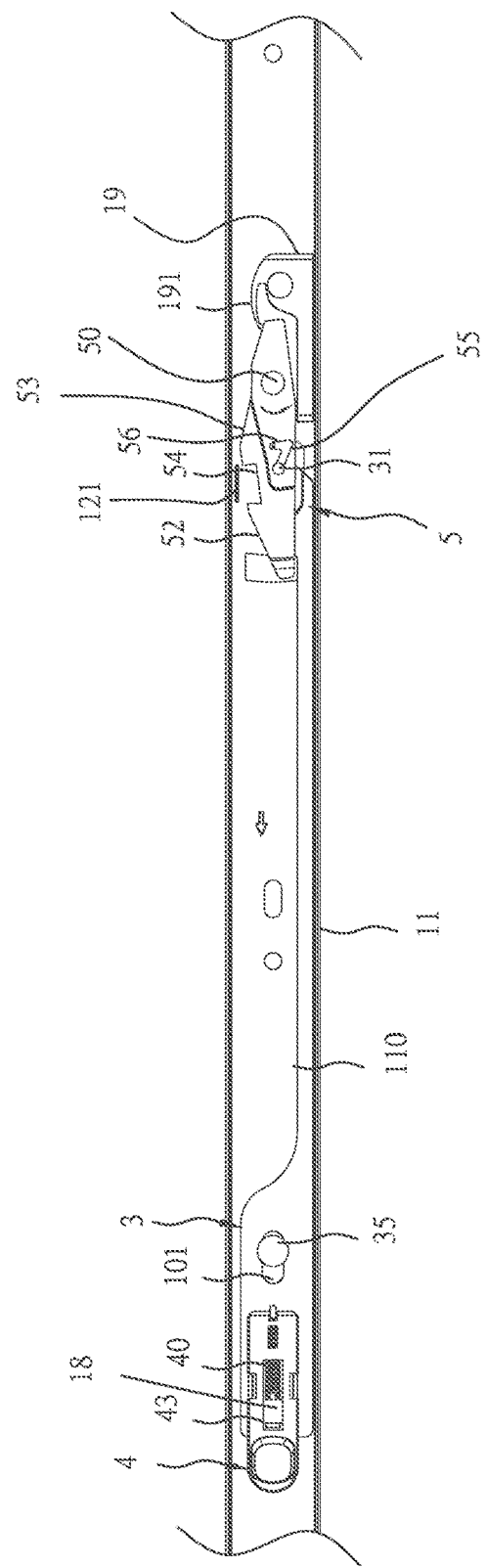
FIG. 11 is a schematic top plan view of the structures in FIGS. 2-10, illustrating when the plastic pull tab and the pull bar are pulled forward and the retaining notch of the engagement plate is disengaged from the stop block of the intermediate sliding.
Figure 12:
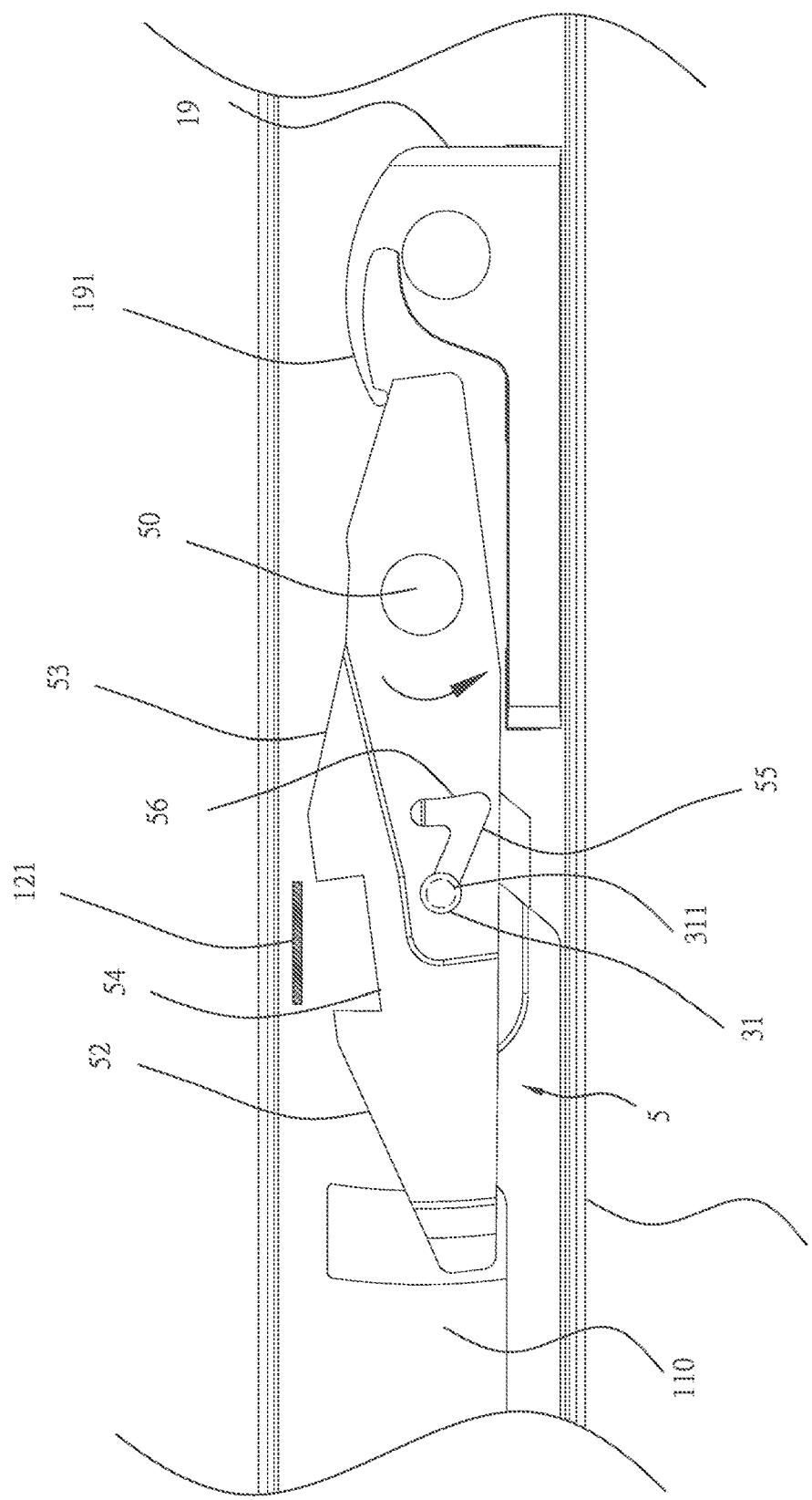
FIG. 12 is an enlarged schematic top plan view of some of the structures shown in FIG. 11 when the plastic pull tab has been pulled forward.
Figure 13:
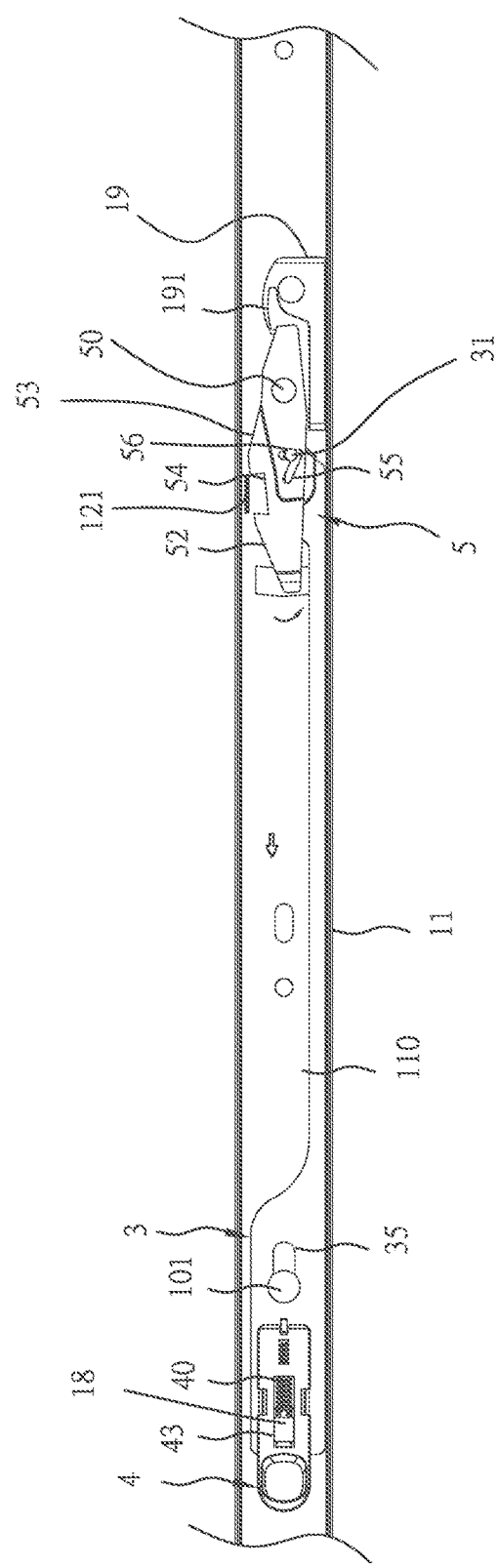
FIG. 13 is a schematic top plan view of the structures in FIGS. 2-12, illustrating the engagement plate directly moved by the user, such that the plastic pull tab has not been pulled forward but the retaining notch of the engagement plate is disengaged from the stop block of the intermediate sliding rail.
Figure 14:
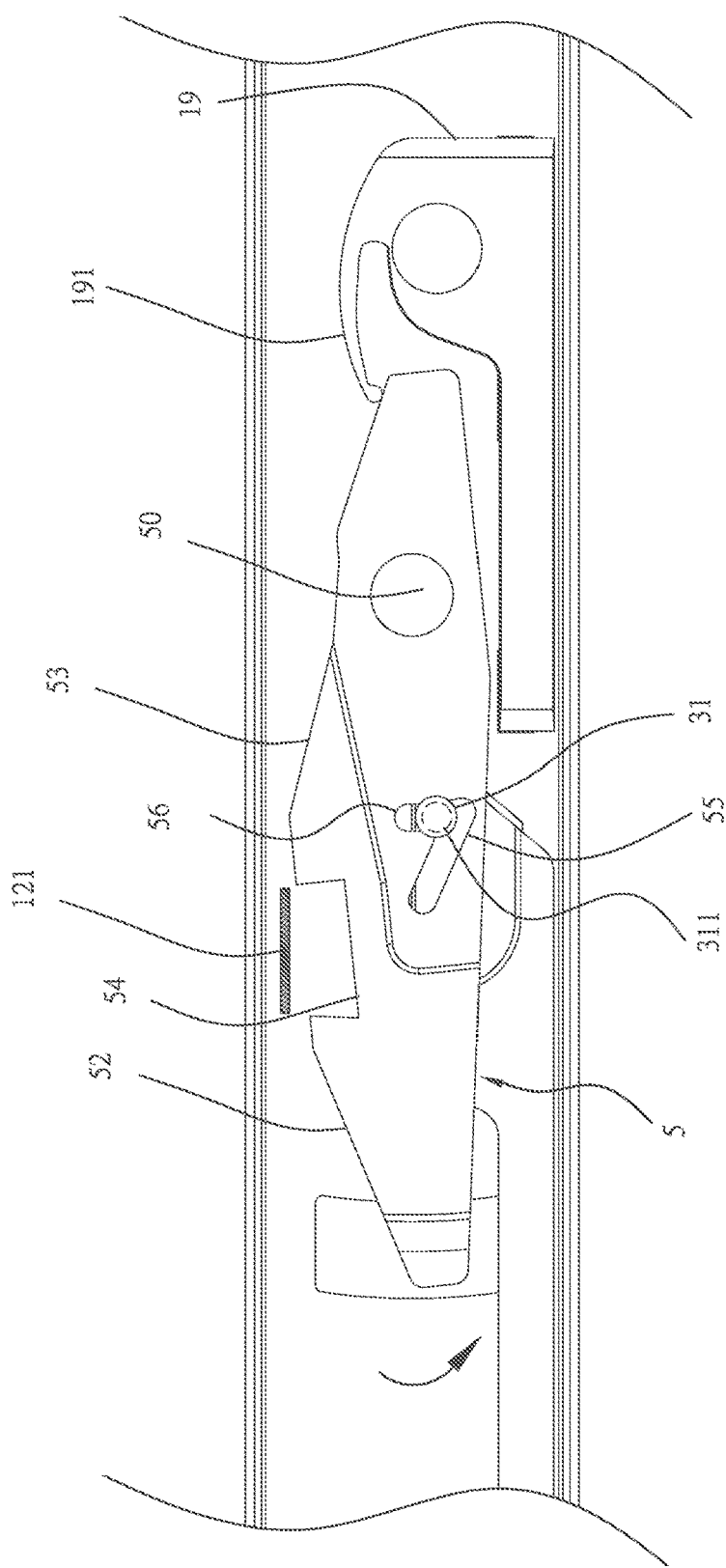
FIG. 14 is an enlarged schematic top plan view of some of the structures shown in FIG. 13 when the engagement plate is directly moved by the user, such that the plastic pull tab has not been pulled forward.

The engagement plate 5 includes a first pivot hole 51 located near a rear end thereof and pivotally connected to a second pivot hole 113 at the inner bottom surface 110 of the inner sliding rail 11 via a pivot pin 50 (see FIG. 2), a front guide edge 52, a rear guide edge 53, a retaining notch 54 disposed between the front guide edge 52 and the rear guide edge 53 and detachably engageable with the stop block 121 of the intermediate sliding rail, a first guide slot 55 that receives the shank 311 of the connection member 31 of the pull bar 3 so that the shank 311 of the connection member 31 of the pull bar 3 is movable along the first guide slot 55 to move the engagement plate 5 and to further force the retaining notch 54 of the engagement plate 5 away from the stop block 121 of the intermediate sliding rail (see FIGS. 11 and 12), and a second guide slot 56 (see also FIG. 15) for enabling a front part of the engagement plate 5 to be directly driven to move the engagement plate 5 in a direction disengaging the retaining notch 54 from the stop block 121 of the intermediate sliding rail without interfering with the shank 311 of the connection member 31 of the pull bar 3 (see FIG. 11 and FIG. 12). Further, the rear end of the engagement plate 5 is abutted against an elastic arm 191 of an elastic member 19 at the inner sliding rail 11. Thus, when the front part of the engagement plate 5 is moved away from its rest position so as to disengage the retaining notch 54 from the stop block 121 of the intermediate sliding rail 12, the rear end of the engagement plate 5 is forced to compress the elastic arm 191, and when the force to compress the elastic arm 191 is removed from the engagement plate 5, an elastic restoring energy of the elastic arm 191 biases the engagement plate 5 to return to its rest position.

When mounting the inner sliding rail 11 in the intermediate sliding rail, the user does not need to pull the plastic pull tab 4 with two hands to drive the plastic pull tab 4 and the pull bar 3 to bias the engagement plate 5. At this time, the user instead simply needs to insert the inner sliding rail 11 into the intermediate sliding rail 12 directly. When inserting the inner sliding rail 11 into the intermediate sliding rail 12, the rear guide edge 53 of the engagement plate 5 will contact and be moved by the stop block 121 of the intermediate sliding rail (see FIG. 7 for initial contact) and pushed by the elastic arm 191 of the elastic member 19 to bias the engagement plate 5 toward its rest position while forcing the retaining notch 54 into engagement with the stop block 121 (see FIG. 5), and thus, the inner sliding rail 11 is loaded into the intermediate sliding rail and prohibited from forward sliding or falling out of the intermediate sliding rail 12. When wishing to continuously push the inner sliding rail 11 rearward toward the inner side of the intermediate sliding rail 12, the plastic pull tab 4 and the pull bar 3 may be pulled forward, for enabling the connection member 31 of the pull bar 3 to move the first guide slot in biasing the engagement plate 5 to further disengage the engagement plate 5 from the stop block 12 of the intermediate sliding rail (see FIG. 6). After disengaging the engagement plate 5 from the stop block 12, the inner sliding rail 11 can then be moved rearward toward the inner side of the intermediate sliding rail 12 (see FIG. 7) to complete the closing operation.

Further, when the inner sliding rail 11 is being moved with the connected server forwardly out of the intermediate sliding rail, the front guide edge 52 of the engagement plate 5 will contact the stop block 121 of the intermediate sliding rail (see FIGS. 8 and 9) to force the retaining notch 54 into engagement with the stop block 121 (see FIG. 10), preventing disconnection of the inner sliding rail 11. Thus, when mounting the inner sliding rail 11 into the intermediate sliding rail after connecting the inner sliding rail 11 to the server, the user does not need to pull the plastic pull tab 4 rearward with two hands, and thus, the installation of the inner sliding rail 11 with the connected server in the intermediate sliding rail 12 is more simple and safe than with the prior art assemblies.

When going to dismount the inner sliding rail 11 with the connected server from the intermediate sliding rail 12, the user simply needs to pull the plastic pull tab 4 forward (see FIGS. 11 and 12), at this time, the connection member 31 of the pull bar 3 will move the engagement plate 5 to disengage the retaining notch 54 from the stop block 121 of the intermediate sliding rail, allowing separation of the inner sliding rail 11 with the connected server from the intermediate sliding rail 12. Further, if the server is heavy, for safety's sake, the user alternatively can directly move the front part of the engagement plate 5 (see FIGS. 13 and 14) to disengage the retaining notch 54 of the engagement plate 5 from the stop block 121 of the intermediate sliding rail, allowing separation of the inner sliding rail 11 with the connected server from the intermediate sliding rail 12 in a safe manner.

Further, in the present preferred embodiment, the sliding rail assembly includes an inner sliding rail 11, an intermediate sliding rail 12 and an outer sliding rail 13. However, as previously discussed, the invention also is applicable to a sliding rail assembly simply consisting of an inner sliding rail 11 and another sliding rail having a stop block, such as an outer sliding rail 13 having the stop block located on the outer sliding rail in similar manner to the stop block shown on the intermediate sliding rail of the preferred embodiment. The description herein regarding the interaction of the detachable inner sliding rail mounting structure with the intermediate sliding rail of the preferred embodiment would instead apply to interaction of the detachable inner sliding rail mounting structure with an outer sliding rail having a stop block similar to that described for the intermediate sliding rail of the preferred embodiment. Accordingly, the invention can be utilized by changing the positioning of the stop block from the aforesaid intermediate sliding rail of a three sliding rail assembly to the outer sliding rail of a two sliding rail assembly, and should be understood as such, when the description refers to an intermediate sliding rail assembly having a stop block.

In conclusion, the detachable inner sliding rail mounting structure for use with a server sliding rail assembly of the present invention has the features and effects as follows:

When mounting the inner sliding rail 11 in the intermediate sliding rail 12, the user does not need to pull the plastic pull tab 4 and the connected pull bar 3 with two hands, and the installation instead can be done simply by directly inserting the inner sliding rail 11 into the intermediate sliding rail 12, thereby enabling the rear guide edge 53 of the engagement plate 5 in the inner sliding rail 11 to be moved by the stop block 121 of the intermediate sliding rail (or the stop block of the outer sliding rail) into the position where the retaining notch 54 of the engagement plate 5 is kept in engagement with the stop block 121 (see FIG. 5).

When dismounting the inner sliding rail 11, the user can operate the plastic pull tab 4 to move the pull bar 3 against the engagement plate 5, forcing the connection member 31 of the pull bar 3 along the first guide slot 55 of the engagement plate 5 to pivot the engagement plate 5 about the pivot pin 50, so that the retaining notch 54 can be disengaged from the stop block 121 of the intermediate sliding rail 12 (see FIGS. 11 and 12), and thus, the operation is quite simple. Further, if the server that is connected to the inner sliding rail 11 is heavy, for safety's sake, a user can directly move the front part of the engagement plate 5 (see FIGS. 13 and 14) to move the engagement plate 5 to disengage the retaining notch 54 from the stop block 121 of the intermediate sliding rail 12 without interfering with the shank 311 of the connection member 31 of the pull bar 3, avoiding danger and ensuring a high level of safety.

The structural design of the detachable inner sliding rail mounting structure of the present invention is quite simple, and the invention can easily be completed by mounting the pull bar 3, the plastic pull tab 4, the engagement plate 5, the guide block 18 and the spring 40 in the inner sliding rail 11, saving much installation labor and time.

The pull bar 3 and the engagement plate 5 can be made using stamping technology, and, the plastic pull tab 4 and the guide block 18 can be made through mass production processing using molding technology. Thus, the invention saves much on mold costs and manufacturing costs, as they can be significantly reduced.

Although a particular embodiment of the present invention has been described in detail for purposes of illustration, various modifications and enhancements may be made without departing from the spirit and scope of the invention. Accordingly, the invention is not to be limited except as by the appended claims.

What is claimed is:

1. A detachable inner sliding rail mounting structure for use in a server sliding rail assembly that has an inner sliding rail and another sliding rail that includes a stop block, the detachable inner sliding rail mounting structure connected to the inner sliding rail and comprising:

a pull bar, a plastic pull tab, a guide block and an engagement plate, wherein:

said pull bar is slidably mounted along an inner bottom surface of said inner sliding rail and comprises a connection hole located at a rear end thereof, a connection member having a shank connected to said connection hole to pivotally connect said engagement plate to said pull bar, an elongated slot that receives a positioning member of said inner sliding rail that limits the range of forward-rearward sliding movement of said pull bar relative to said inner sliding rail, and an opposing front end connected to said plastic pull tab;

said plastic pull tab comprises a sliding groove, two rails respectively extended along two opposite lateral sides of said sliding groove and being coupled to said guide block so that said plastic pull tab is movable forward and rearward relative to said guide block, a spring retaining portion located at a rear side relative to said sliding groove, and a spring having one end thereof connected to said spring retaining portion and an opposite end thereof connected to said guide block such that at rest said pull tab is in a rearward position and when said plastic pull tab is being pulled forward, said spring is compressed, and when said pulling force is removed, an elastic restoring energy of said spring moves said plastic pull tab to the rearward position;

said guide block comprises two guide grooves arranged at two opposite lateral sides thereof and that are respectively coupled to said two rails of said plastic pull tab, a mounting portion located at a bottom side thereof and connected to a positioning groove of said inner sliding rail, and a spring retainer tip located at a rear end thereof and connected to said opposite end of said spring;

said engagement plate comprises a first pivot hole located near a rear end thereof and being pivotally connected to a second pivot hole at said inner bottom surface of said inner sliding rail via a pivot pin, a front guide edge, a rear guide edge, a retaining notch disposed between said front guide edge and said rear guide edge and detachably engageable with said stop block of said another sliding rail, a first guide slot that receives said shank of said connection member of said pull bar so that said shank of said connection member of said pull bar is movable along said first guide slot to move said engagement plate and to further force said retaining notch of said engagement plate away from said stop block of said another sliding rail, and a second guide slot for enabling a front part of said engagement plate to be directly driven to move said engagement plate in a direction disengaging said retaining notch from said stop block of said another sliding rail, said rear end of said engagement plate being abutted against an elastic arm of an elastic member at said inner sliding rail so that when said front part of said engagement plate is moved away from its rest position so as to disengage said retaining notch from said stop block of said another sliding rail, said rear end of said engagement plate is forced to compress said elastic arm, and when the force to compress the elastic arm is removed from said engagement plate, an elastic restoring energy of said elastic arm biases said engagement plate to return to its rest position.

2. The detachable inner sliding rail mounting structure for use in a server sliding rail assembly as claimed in claim 1, wherein said pull bar further comprises an opening, and a plurality of mounting lugs disposed around said opening that connect to said plastic pull tab.

3. The detachable inner sliding rail mounting structure for use in a server sliding rail assembly as claimed in claim 1, wherein said pull bar has a front end thereof directly riveted to said plastic pull tab.

4. The detachable inner sliding rail mounting structure for use in a server sliding rail assembly as claimed in claim 1, wherein said inner sliding rail is configured to be connected to a sidewall of a server.

5. The detachable inner sliding rail mounting structure for use in a server sliding rail assembly as claimed in claim 1, wherein said another sliding rail is an intermediate sliding rail slidably coupled between said inner sliding rail and an outer sliding rail, and said intermediate sliding rail includes said stop block.

6. The detachable inner sliding rail mounting structure for use in a server sliding rail assembly as claimed in claim 5, wherein said outer sliding rail is configured to be connected to an inner sidewall of a server cabinet.

* * * * *